(12) United States Patent
Tai et al.

(10) Patent No.: US 10,720,566 B2
(45) Date of Patent: Jul. 21, 2020

(54) BONDING METHOD

(71) Applicant: NGK INSULATORS, LTD., Nagoya, Aichi (JP)

(72) Inventors: Tomoyoshi Tai, Inazawa (JP); Yuji Hori, Owariasahi (JP); Keiichiro Asai, Nagoya (JP); Takashi Yoshino, Ama (JP); Masashi Goto, Nagoya (JP); Masahiko Namerikawa, Seto (JP)

(73) Assignee: NGK INSULATORS, LTD., Nagoya, Aichi (JP)

( * ) Notice: Subject to any disclaimer, the term of this patent is extended or adjusted under 35 U.S.C. 154(b) by 13 days.

(21) Appl. No.: 16/135,577

(22) Filed: Sep. 19, 2018

(65) Prior Publication Data
US 2019/0036008 A1 Jan. 31, 2019

Related U.S. Application Data

(63) Continuation of application No. PCT/JP2017/006463, filed on Feb. 22, 2017.

(30) Foreign Application Priority Data

Mar. 25, 2016 (JP) .................. 2016-061713

(51) Int. Cl.
*H01L 41/313* (2013.01)
*H01L 41/22* (2013.01)
(Continued)

(52) U.S. Cl.
CPC ............ *H01L 41/313* (2013.01); *H01L 41/09* (2013.01); *H01L 41/187* (2013.01);
(Continued)

(58) Field of Classification Search
CPC ..... H01L 41/09; H01L 41/187; H01L 41/313; H01L 41/337; H01L 21/2007;
(Continued)

(56) References Cited

U.S. PATENT DOCUMENTS 7,213,314 B2 5/2007 Abbott et al.
7,331,092 B2 2/2008 Miura et al.
(Continued)

FOREIGN PATENT DOCUMENTS

JP 2005349714 A * 12/2005
JP 3774782 B2 5/2006
(Continued)

OTHER PUBLICATIONS

English language International Search Report for corresponding PCT/JP2017/006463 (1 pg.).
(Continued)

*Primary Examiner* — A. Dexter Tugbang
(74) *Attorney, Agent, or Firm* — Flynn Thiel, P.C.

(57) ABSTRACT

It is formed, over a supporting body made of a ceramic, a bonding layer composed of one or more material selected from the group consisting of mullite, alumina, tantalum pentoxide, titanium oxide and niobium pentoxide. Neutralized beam is irradiated onto a surface of the bonding layer to activate the surface of the bonding layer. The surface of the bonding layer and the piezoelectric single crystal substrate are bonded by direct bonding.

6 Claims, 4 Drawing Sheets

(51) Int. Cl.
| | |
|---|---|
| H03H 9/02 | (2006.01) |
| H01L 41/09 | (2006.01) |
| H01L 41/187 | (2006.01) |
| H01L 41/337 | (2013.01) |
| H03H 9/25 | (2006.01) |
| H03H 3/08 | (2006.01) |
| H01L 23/00 | (2006.01) |
| H01L 21/20 | (2006.01) |

(52) U.S. Cl.
CPC ....... H01L 41/337 (2013.01); H03H 9/02559 (2013.01); H03H 9/02574 (2013.01); H03H 9/02622 (2013.01); H03H 9/25 (2013.01); H01L 21/2007 (2013.01); H01L 24/83 (2013.01); H03H 3/08 (2013.01); Y10T 29/42 (2015.01)

(58) Field of Classification Search
CPC ........... H01L 24/83; H01L 41/22; H03H 3/08; H03H 9/02559; H03H 9/02574; H03H 9/02622; H03H 9/25; Y10T 29/42
See application file for complete search history.

(56) References Cited

U.S. PATENT DOCUMENTS

| | | | |
|---|---|---|---|
| 7,736,993 B2 | 6/2010 | Allibert et al. | |
| 7,977,747 B2 | 7/2011 | Allibert et al. | |
| 8,264,303 B2 | 9/2012 | Suzuki | |
| 8,729,771 B2 * | 5/2014 | Kobayashi | Y10T 29/42 |
| | | | 310/313 R |
| 8,866,365 B2 | 10/2014 | Hori et al. | |
| 9,680,083 B2 | 6/2017 | Hori et al. | |
| 2002/0056827 A1* | 5/2002 | Kashiwaya | Y10T 29/42 |
| | | | 252/62.9 PZ |
| 2009/0081424 A1 | 3/2009 | Gomi | |
| 2010/0276723 A1* | 11/2010 | Utsumi | H01L 21/2007 |
| | | | 257/99 |
| 2015/0008789 A1 | 1/2015 | Iwamoto | |
| 2015/0365067 A1 | 12/2015 | Hori et al. | |
| 2016/0049469 A1 | 2/2016 | Yoshikawa et al. | |
| 2019/0036009 A1* | 1/2019 | Tai | H01L 41/337 |
| 2019/0036509 A1* | 1/2019 | Tai | H01L 41/09 |

FOREIGN PATENT DOCUMENTS

| | | |
|---|---|---|
| JP | 2010-187373 A | 8/2010 |
| JP | 3184763 U | 7/2013 |
| JP | 2014-086400 A | 5/2014 |
| JP | 2015/145054 A | 8/2015 |
| JP | 5814727 B2 | 11/2015 |
| KR | 1020070077438 A | 7/2007 |
| KR | 1020120035900 A | 4/2012 |
| KR | 1020150115020 A | 10/2015 |
| WO | WO 2011/158636 A1 | 12/2011 |
| WO | WO 2013/146374 A1 | 10/2013 |
| WO | WO 2014/010696 A1 | 1/2014 |
| WO | WO 2014/027538 A1 | 2/2014 |
| WO | WO 2014/192597 A1 | 12/2014 |

OTHER PUBLICATIONS

Office Action of Korean Patent Office issued in Korean Application No. 10-2018-7022829 dated Mar. 4, 2019 (11 pages).
German Office Action for corresponding application No. 11 2017 001 539.1, dated Jul. 24, 2019, including English translation thereof (9 pages).
International Preliminary Report on Patentability for PCT/JP2017/006463, dated Sep. 25, 2018 (1 page).
English translation of Written Opinion of the International Searching Authority for PCT/JP2017/006463, dated Apr. 4, 2017 (5 pages).

* cited by examiner

BONDING METHOD

CROSS-REFERENCE TO RELATED APPLICATIONS

This is a continuation of International Application No. PCT/JP2017/006463, filed Feb. 22, 2017, which claims priority of Japanese Patent Application No. 2016-061713, filed Mar. 25, 2016, the entire contents of which are incorporated herein by reference.

TECHNICAL FIELD

The present invention relates to a method of bonding a piezoelectric single crystal substrate and a supporting body composed of a ceramic.

BACKGROUND ARTS

It is known a surface acoustic wave device functioning as a filter device or oscillator used in mobile phones or the like and an acoustic wave device such as lamb wave device or film bulk acoustic resonator (FBAR) using a piezoelectric thin film. As such acoustic wave device, it is known a device produced by adhering a supporting body and a piezoelectric substrate propagating a surface acoustic wave and by providing interdigitated electrodes capable of oscillating the surface acoustic wave on a surface of the piezoelectric substrate. By adhering the supporting body whose thermal expansion coefficient is lower than that of the acoustic substrate onto the piezoelectric substrate, the change of a size of the acoustic substrate responsive to temperature change is reduced so that the change of the frequency characteristics as the surface acoustic wave device is reduced.

For example, it is proposed, in patent document 1, a surface acoustic wave device having the structure produced by adhering a piezoelectric substrate and silicon substrate with an adhesive layer composed of an epoxy adhering agent.

Here, it is known that, in bonding a piezoelectric substrate and silicon substrate, a silicon oxide film is formed on a surface of the piezoelectric substrate, and a silicon substrate and the piezoelectric substrate are bonded through the silicon oxide film (patent document 2). In the bonding, plasma beam is irradiated onto the surfaces of the silicon oxide film and silicon substrate to activate the surfaces, followed by the direct boding (plasma activation method).

Further, it is known that a surface of the piezoelectric substrate is made a roughened surface, a filler layer is provided on the roughened surface to provide a flattened surface, and the filler layer is adhered onto a silicon substrate through an adhering layer (patent document 3). According to this method, an epoxy based or acryl based resin is used for the filler layer and adhering layer, and the bonding surface of the piezoelectric substrate is made the roughened surface to reduce the reflection of bulk wave and to reduce spurious wave.

Further, it is known direct bonding method of so-called FAB (Fast Atom Beam) system (patent document 4). According to this method, neutralized atomic beam is irradiated onto the respective bonding faces at ambient temperature to activate them, followed by direct bonding.

On the other hand, according to patent document 5, it is described that a piezoelectric single crystal substrate is directly bonded to a supporting body made of a ceramic (alumina, aluminum nitride, silicon nitride) and not to a silicon substrate, through an intermediate layer. A material of the intermediate layer is silicon, silicon oxide, silicon nitride or aluminum nitride.

PRIOR ART DOCUMENTS

Patent Documents (Patent document 1) Japanese Patent publication No. 2010-187373A
(Patent document 2) U.S. Pat. No. 7,213,314 B2
(Patent document 3) Japanese Patent No. 5814727 B
(Patent document 4) Japanese Patent publication No. 2014-086400A
(Patent document 5) Japanese Patent No. 3774782B

SUMMARY OF THE INVENTION

Object to be Solved by Invention

However, in the case that the piezoelectric single crystal substrate is directly bonded to a supporting body made of a ceramic by plasma activation method, cracks are generated due to a difference of thermal expansion of the piezoelectric single crystal substrate and ceramic during heating after the bonding. Further, in the case that the heating is not performed after the bonding, the bonding strength becomes low so that they are separated during processing steps.

On the other hand, according to the method described in patent document 5, a predetermined intermediate layer is provided on a surface of a supporting body made of a ceramic, ionized beam is irradiated onto the intermediate layer to activate it, and the intermediate layer is directly bonded to a piezoelectric single crystal substrate. However, as the inventors actually tried to fabricate a bonded body, the bonding strength was proved to be still insufficient so that the separation occurred in the subsequent processing steps.

An object of the present invention is, in directly bonding a piezoelectric single crystal substrate and a supporting body made of a ceramic, to enable the bonding at ambient temperature and to improve the bonding strength.

Means for Solving Object

The present invention provides a method of bonding a supporting body comprising a ceramic and a piezoelectric single crystal substrate, said method comprising the steps of:
forming a bonding layer over the supporting body, the bonding layer comprising one or more material selected from the group consisting of mullite, alumina, tantalum pentoxide, titanium oxide and niobium pentoxide;
irradiating neutralized beam onto a surface of the bonding layer to active the surface of the bonding layer; and
bonding the surface of the bonding layer and the piezoelectric single crystal substrate by direct bonding.

According to the present invention, in directly bonding a piezoelectric single crystal substrate and a supporting body made of a ceramic, the bonding at ambient temperature can be performed and the bonding strength can be improved.

MODES FOR CARRYING OUT THE INVENTION

Figure 1A:
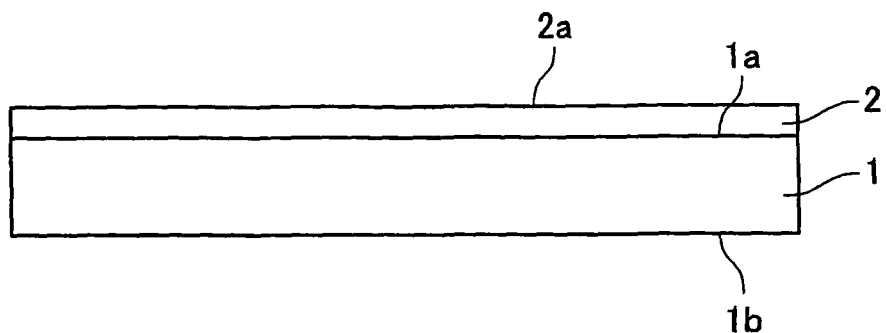
FIG. 1(a) shows the state that a bonding layer 2 is provided on a supporting body made of a ceramic.

The present invention will be described in detail below, appropriately referring to the drawings.

FIGS. 1 and 2 relate to an embodiment that a bonding layer is provided on a supporting body and then bonded to a surface of a piezoelectric single crystal substrate by direct bonding.

Figure 1B:
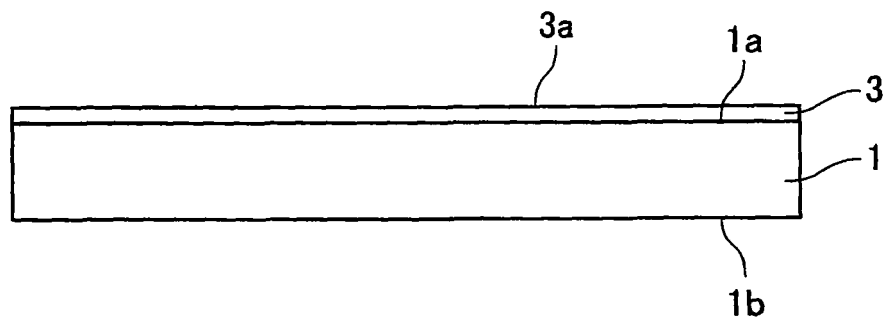
FIG. 1(b) shows the state that a surface 3a of a bonding layer 3 is subjected to flattening.

As shown in FIG. 1(a), a bonding layer 2 is provided on a surface 1a of a supporting body 1 made of a ceramic. 1b represents a surface on the opposite side. At this time, unevenness may be present on the surface 2a of the bonding layer 2.

Then, according to a preferred embodiment, the surface 2a of the bonding layer 2 is subjected to a flattening process to form a flat surface 3a. By this flattening process, a thickness of the bonding layer 2 is usually lowered to a thinner bonding layer 3 (refer to FIG. 1(b)). However, the flattening process is not indispensable.

Figure 1C:
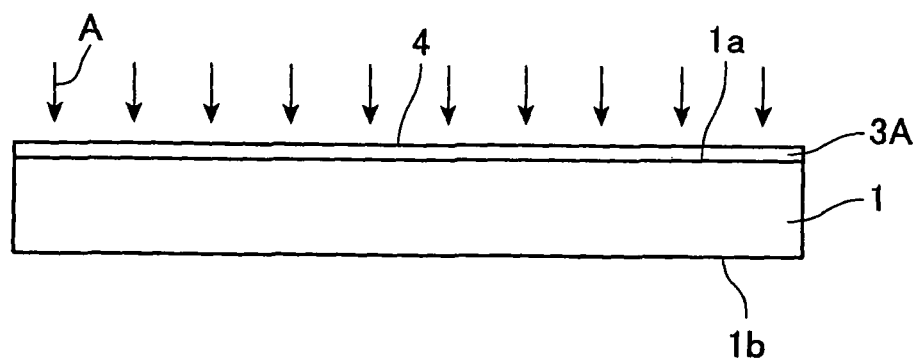
FIG. 1(c) shows the state that a flat surface 4 is activated by neutralized beam.

Then, a neutralized beam is irradiated onto the flat surface 3a as an arrow A, as shown in FIG. 1(c), to activate the surface of the bonding layer 3A to obtain an activated surface 4.

Figure 2A:
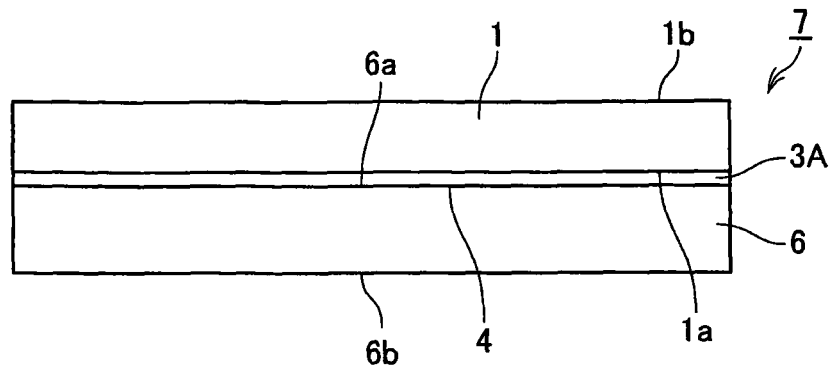
FIG. 2(a) shows the state that a piezoelectric single crystal substrate 6 and the supporting body 1 are bonded with each other.

On the other hand, as shown in FIG. 2(a), a neutralized beam is irradiated onto a surface of a piezoelectric single crystal substrate 6 to activate it to provide an activated surface 6a. Then, the activated surface 6a of the piezoelectric single crystal substrate 6 and the activated surface 4 of the bonding layer 3A are bonded by direct bonding to obtain a bonded body 7.

Figure 2B:
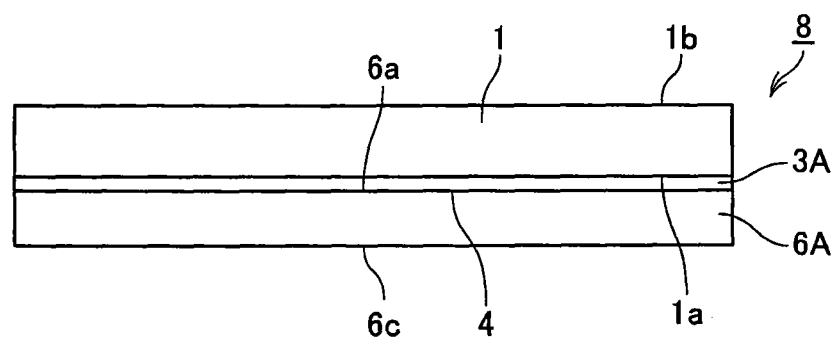
FIG. 2(b) shows the state that the piezoelectric single crystal substrate 6A is thinned by processing.

According to a preferred embodiment, the surface 6b of the piezoelectric single crystal substrate of the bonded body 7 is further subjected to polishing, so that the thickness of a piezoelectric single crystal substrate 6A is made smaller as shown in FIG. 2(b), providing a bonded body 8. A numeral 6 represents a polished surface.

Figure 2C:
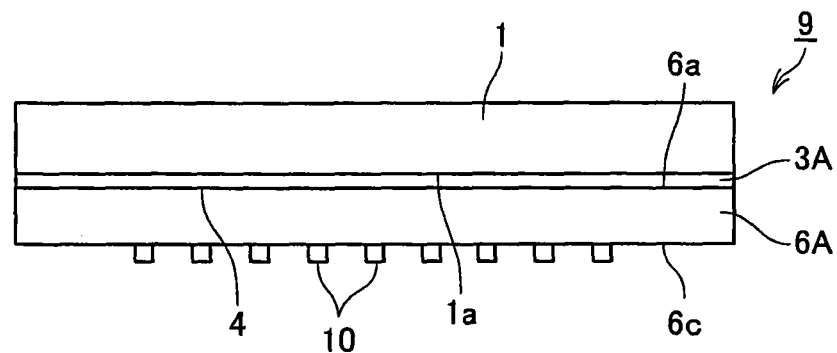
FIG. 2(c) shows the state that electrodes 10 are provided on a piezoelectric single crystal substrate 6A.

According to FIG. 2(c), predetermined electrodes 10 are formed on a polished surface 6c of the piezoelectric single crystal substrate 6A to produce an acoustic wave device 9.

FIGS. 3 and 4 relate to an embodiment in which a surface of a piezoelectric single crystal substrate is made a roughened surface.

Figure 3A:
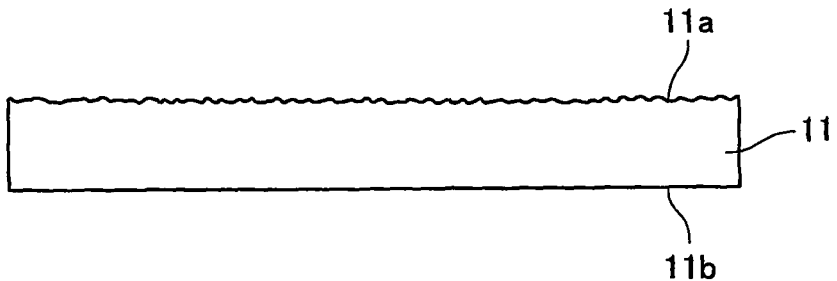
FIG. 3(a) shows the state that a surface 11a of a piezoelectric single crystal substrate 11 is made a roughened surface.
Figure 4A:
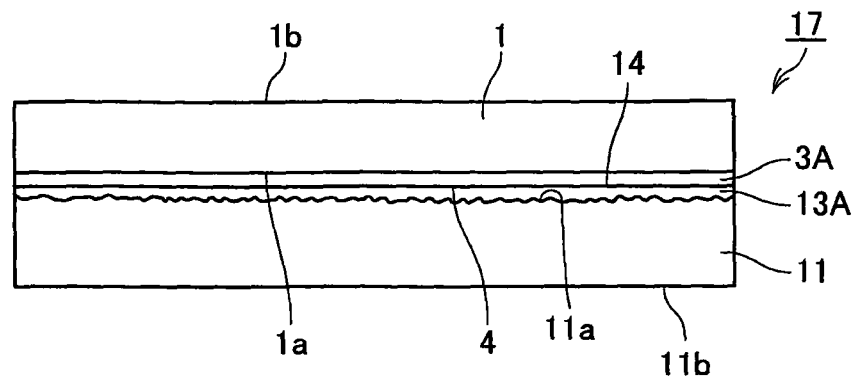
FIG. 4(a) shows the state that the piezoelectric single crystal substrate 11 and supporting body 1 are bonded with each other.

As shown in FIG. 3(a), a surface 11a of a piezoelectric single crystal substrate 11 is processed to form a roughened surface 11a. 11b represents a surface on the opposite side.

Figure 3B:
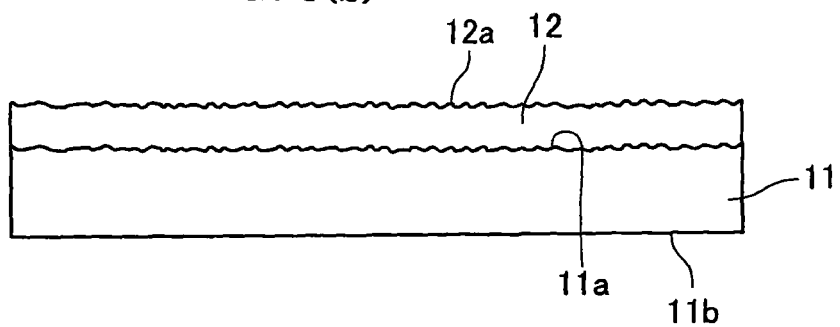
FIG. 3(b) shows the state that an intermediate layer 12 is provided on the roughened surface.

Then, as shown in FIG. 3(b), an intermediate layer 12 is provided on the roughened surface 11a. At this time, the roughened surface is transcripted onto a surface 12a of the intermediate layer 12 and an unevenness is formed.

Figure 3C:
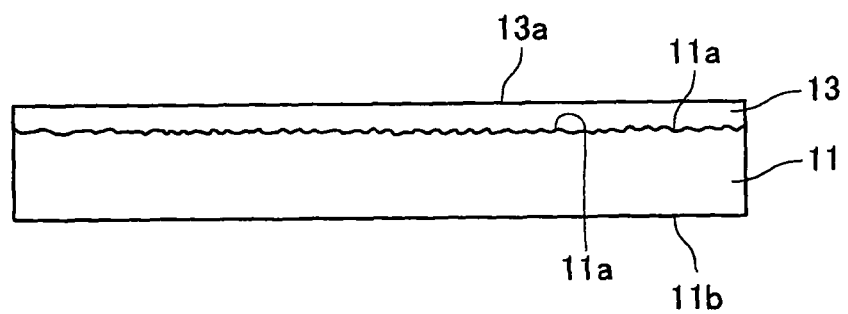
FIG. 3(c) shows the state that a surface 13a of an intermediate layer 13 is subjected to a flattening process.
Figure 3D:
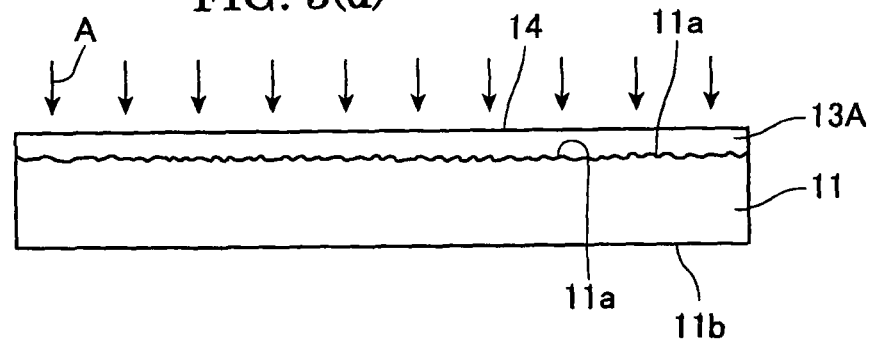
FIG. 3(d) shows the state that a flat surface 14 is activated by neutralized beam A.

Then, according to a preferred embodiment, the surface 12a of the intermediate layer 12 is subjected to a flattening process to form a flat surface 13a as shown in FIG. 3(c). By this flattening process, a thickness of the bonding layer 12 is usually lowered to a thinner bonding layer 13. Then, a neutralized beam is irradiated onto the flat surface 13a as an arrow A, as shown in FIG. 3(d), to activate the surface of the bonding layer 13A to obtain an activated surface 14.

On the other hand, as shown in FIG. 1(c), a neutralized beam is irradiated onto a flat surface of a bonding layer 3A on the supporting body 1 to activate it to provide an activated surface 4. Then, the activated surface 4 of the bonding layer 3A and the activated surface 14 of the intermediate layer 13A are bonded by direct bonding to obtain a bonded body 17 (FIG. 4(a)).

Figure 4B:
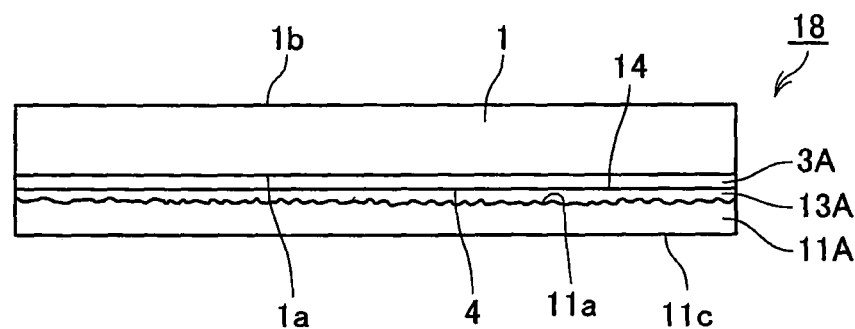
FIG. 4(b) shows the state that a piezoelectric single crystal substrate 11A is thinned by processing.

According to a preferred embodiment, the surface 11b of the piezoelectric single crystal substrate of the bonded body 17 is further subjected to polishing, so that the thickness of the piezoelectric single crystal substrate 11A is made smaller as shown in FIG. 4(b), providing a bonded body 18. 11c represents a polished surface.

Figure 4C:
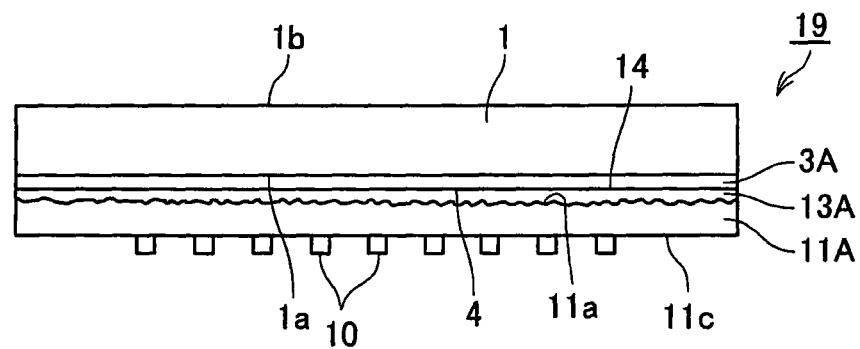
FIG. 4(c) shows the state that electrodes are provided on a piezoelectric single crystal substrate 11A.

Further, in the case of a surface acoustic wave device 19 of FIG. 4(c), predetermined electrodes 10 are formed on a polished surface 11c of the piezoelectric single crystal substrate 11A.

Respective constituents of the present invention will be described further in detail below.

Applications of the bonded bodies of the present invention are not particularly limited, and they can be appropriately applied to an acoustic wave device and optical device, for example.

As an acoustic wave device, a surface acoustic wave device, Lamb wave-type device, thin film resonator (FBAR) or the like is known. For example, the surface acoustic wave device is produced by providing input side IDT (Interdigital transducer) electrodes (also referred to as comb electrodes or interdigitated electrodes) for an oscillating surface acoustic wave and IDT electrode on the output side for receiving the surface acoustic wave, on the surface of the piezoelectric single crystal substrate. By applying a high frequency signal on the IDT electrode on the input side, an electric field is generated between the electrodes, so that the surface acoustic wave is oscillated and propagated on the piezoelectric substrate. Then, the propagated surface acoustic wave is drawn as an electrical signal from the IDT electrodes on the output side provided in the direction of the propagation.

A metal film may be provided on a bottom surface of the piezoelectric single crystal substrate. After the Lamb type device is produced as the acoustic wave device, the metal film plays a role of improving the electro-mechanical coupling factor near the bottom surface of the piezoelectric substrate. In this case, the Lamb type device has the structure that interdigitated electrodes are formed on the surfaces of the piezoelectric single crystal surface and the metal film on the piezoelectric substrate is exposed through a cavity provided in the supporting body. Materials of such metal films include aluminum, an aluminum alloy, copper, gold or the like, for example. Further, in the case that the Lamb type wave device is produced, it may be used a composite substrate having the piezoelectric single crystal substrate without the metal film on the bottom surface.

Further, a metal film and an insulating film may be provided on the bottom surface of the piezoelectric single crystal substrate. The metal film plays a role of electrodes in the case that the thin film resonator is produced as the acoustic wave device. In this case, the thin film resonator has the structure that electrodes are formed on the upper and bottom surfaces of the piezoelectric substrate and the insulating film is made a cavity to expose the metal film on the piezoelectric single crystal substrate. Materials of such metal films include molybdenum, ruthenium, tungsten, chromium, aluminum or the like, for example. Further, materials of the insulating films include silicon dioxide, phosphorus silicate glass, boron phosphorus silicate glass or the like.

Further, as the optical device, it may be listed an optical switching device, wavelength conversion device and optical modulating device. Further, a periodic domain inversion structure may be formed in the piezoelectric single crystal substrate.

In the case that the present invention is applied to the optical device, the size of the optical device can be reduced. Further, particularly in the case that the periodic domain inversion structure is formed, it is possible to prevent the deterioration of the periodic domain inversion structure by heat treatment. Further, the materials of the bonding layers of the present invention are of high insulation, the generation of domain inversion is prevented during the processing by the neutralized beam before the bonding, and the shape of the domain inversion structure formed in the piezoelectric single crystal substrate is hardly disordered.

According to the present invention, the surface of the piezoelectric single crystal substrate can be activated by a neutralized beam. Particularly in the case that the surface of the piezoelectric single crystal substrate is a flat surface, this surface can be directly bonded to the bonding layer. However, when the piezoelectric single crystal substrate is roughened, it is preferred to provide the intermediate layer to make the surface flat and then activated by the neutralized beam. The thus activated flat surface of the intermediate layer on the piezoelectric single crystal substrate can be directly bonded to the bonding layer on the supporting body.

Specifically, as the material of the piezoelectric single crystal substrate, single crystals of lithium tantalate (LT), lithium niobate (LN), lithium niobate-lithium tantalate solid solution, quartz and lithium borate may be listed. Among them, LT or LN are more preferred. As LT or LN has a high propagation speed of a surface acoustic wave and large electro-mechanical coupling factor, it is preferred for use in a piezoelectric surface wave device for high frequency and wide-band frequency applications. Further, the normal direction of the main surface of the piezoelectric single crystal substrate is not particularly limited. However, in the case that the piezoelectric single crystal substrate is made of LT, for example, it is preferred to use the substrate rotated toward the Y-axis or Z-axis by 36 to 47° (for example 42°) with respect to the X-axis, which is a direction of propagation of a surface acoustic wave, because of a low propagation loss. In the case that the piezoelectric single crystal substrate is made of LN, it is preferred to use the substrate rotated toward the Y-axis or Z-axis by 60 to 68° (for example 64°) with respect to the X-axis, which is a direction of propagation of a surface acoustic wave, because of a lower propagation loss. Further, although the size of the piezoelectric single crystal substrate is not particularly limited, for example, the diameter may be 50 to 150 mm and thickness may be 0.2 to 60 prn.

The material of the supporting body is a ceramic material. The ceramic material may preferably be selected from the group consisting of mullite, cordierite and sialon.

The bonding layer is formed on the supporting body. The bonding layer is made of a material selected from the group consisting of mullite, alumina, tantalum pentoxide, titanium oxide and niobium pentoxide. Although the film-forming method of the bonding layer is not limited, sputtering, chemical vapor deposition (CVD) and vapor deposition are listed.

Then, according to a preferred embodiment, the surface of the bonding layer is flattened to obtain the flat surface. Here, the method of flattening the surface of the bonding layer includes lapping, chemical mechanical polishing (CMP) and the like. Further, the arithmetic average roughness Ra of the flat surface may preferably be Ra≤1 nm and more preferably be Ra≤0.3 nm.

According to a preferred embodiment, the surface of the piezoelectric single crystal substrate is processed to form the roughened surface. The roughened surface means a surface, in which an unevenness is formed periodically and uniformly in a plane, having an arithmetic surface roughness of 0.05 μm≤Ra≤0.5 μm and a height Ry from the lowest bottom of a valley to the highest peak of mountain of 0.5 μm≤Ry≤5 μm. The preferred roughness is depending on the wavelength of an acoustic wave and appropriately selected so that the reflection of the bulk wave can be prevented.

Further, the method of roughening includes grinding, polishing, etching, sand blasting or the like.

Then, according to a preferred embodiment, a neutralized beam is irradiated onto the flat surface of the bonding layer to activate the flat surface of the bonding layer.

Further, the surface of the piezoelectric single crystal substrate or the surface of the intermediate layer thereon is flattened to obtain a flat surface. Here, the method of flattening the surface of the piezoelectric single crystal substrate or intermediate layer includes lapping, chemical mechanical polishing (CMP) and the like. Further, the arithmetic average roughness Ra of the flat surface may preferably be Ra≤1 nm and more preferably be Ra≤0.3 nm.

In the case that the intermediate layer is formed on the roughened surface of the piezoelectric single crystal substrate, it is particularly preferred to flatten the surface of the intermediate layer. On the other hand, in the case that the surface of the supporting body or surface of the piezoelectric single crystal substrate is flat, although it is not indispensable to flatten the surface of the bonding layer or the surface of the intermediate layer, flattening may be performed.

The intermediate layer is made of a material selected from the group consisting of mullite, alumina, tantalum pentoxide, titanium oxide and niobium pentoxide. Although the film-forming method of the intermediate layer is not limited, sputtering, chemical vapor deposition (CVD) and vapor deposition are listed.

Then, the neutralized beam is irradiated onto the surface of the piezoelectric single crystal substrate or the flat surface of the intermediate layer on the piezoelectric single crystal substrate to activate the flat surface.

When the activation of the surfaces is performed using the neutralized beam, it is preferred to use a system described in patent document 4 to generate the neutralized beam, which is irradiated. That is, a high speed atomic beam source of saddle field type is used as the beam source. Then, an inert gas is introduced into the chamber and a high voltage is applied onto the electrodes from a direct current electric source. By this, an electric field of the saddle field type generated between the electrode (positive electrode) and a housing (negative electrode) causes the motion of electrons, e, so that atomic and ion beams derived from the inert gas are generated. Among the beams reaching a grid, the ion beam is neutralized at the grid, and a beam of neutral atoms is emitted from the high speed atomic beam source. Atomic species forming the beam may preferably be an inert gas (argon, nitrogen or the like).

The voltage during the activation by the irradiation of the beam may preferably be 0.5 to 2.0 kV and current is preferably 50 to 200 mA.

Then, the activated surfaces are contacted and bonded with each other under a vacuum atmosphere. The temperature at this time may be an ambient temperature, specifically 40° C. or lower and more preferably 30° C. or lower. Further, the temperature during the bonding may more preferably be 20° C. or higher and 25° C. or lower. The pressure at the bonding is preferably 100 to 20000N.

EXAMPLES (Example A1)

A bonded body was produced, according to the method described referring to FIGS. 1 and 2.

Specifically, a substrate (LT substrate) of lithium tantalate having an orientation flat (OF) part, a diameter of 4 inches and thickness of 250 μm was used as the piezoelectric single crystal substrate 6. Further, as the supporting body 1, a body 1 was prepared having an OF part, a diameter of 4 inches, a thickness of 230 μm and made of mullite. As the LT substrate, a LT substrate of 46° Y-cut X-propagation LT substrate was used, in which the direction of propagation of the surface acoustic wave (SAW)was X and the Y-cut plate was rotated in a cutting angle. The surface 6a of the piezoelectric single crystal substrate 6 was mirror-polished to an arithmetic average roughness Ra of 1 nm. The arithmetic surface roughness Ra of the surface 6a of the supporting body 6 of mullite was 2 nm. The arithmetic surface roughness Ra was measured by an atomic force microscope (AFM) in a visual field of a square of a length of 10 μm and a width of 10 μm.

Then, a bonding layer 2 made of mullite was formed of 1.0 μm by a CVD method on the surface 1a of the supporting body 1. Ra after the film-formation was 2.0 nm. Then, the bonding layer 2 was subjected to chemical mechanical polishing (CMP) to a thickness of 0.5 μm and Ra of 0.3 nm.

Then, the flat surface 3a of the bonding layer 3 and the surface 6a of the piezoelectric single crystal substrate 6 were cleaned to remove contamination, followed by introduction into a vacuum chamber. The chamber was evacuated to an order of $10^{-6}$ Pa and high speed atomic beam (acceleration voltage of 1 kV and Ar flow rate of 27 sccm) was irradiated onto the bonding surfaces of the respective substrates for 120 sec. Then, the beam-irradiated surface (activated surface) 4 of the bonding layer 3A and activated surface 6a of the piezoelectric single crystal substrate 6 were contacted with each other, followed by pressurizing at 10000N for 2 minutes to bond the respective substrates.

Then, the surface 6b of the piezoelectric single crystal substrate 6 was ground and polished until the thickness was changed from the initial thickness of 250 μm to 20 μm (refer to FIG. 2(b)). The separation of the bonded parts was not observed during the grinding and polishing steps. Further, the bonding strength was evaluated by crack opening method and proved to be 1.4 $J/m^2$.

Example A2

In the Example A1, the bonded body 2 was produced according to the same procedure as the Example A1, except that the material of the bonding layer 2 was made alumina and that sputtering was used for the film-formation of the bonding layer 2.

As a result, the separation of the bonded parts was not observed during the grinding and polishing steps of the piezoelectric single crystal substrate. Further, the bonding strength was evaluated by crack opening method and proved to be 1.3 $J/m^2$.

Example A3

In the Example A1, the bonded body 2 was produced according to the same procedure as the Example A1, except that the material of the bonding layer 2 was made tantalum pentoxide and that sputtering was used for the film-formation of the bonding layer 2.

As a result, the separation of the bonded parts was not observed during the grinding and polishing steps of the piezoelectric single crystal substrate. Further, the bonding strength was evaluated by crack opening method and proved to be 1.3 $J/m^2$.

Example A4

In the Example A1, the bonded body 2 was produced according to the same procedure as the Example A1, except that the material of the bonding layer 2 was made titanium oxide and that sputtering was used for the film-formation of the bonding layer 2.

As a result, the separation of the bonded parts was not observed during the grinding and polishing steps of the piezoelectric single crystal substrate. Further, the bonding strength was evaluated by crack opening method and proved to be 1.6 $J/m^2$.

Example A5

In the Example A1, the bonded body 2 was produced according to the same procedure as the Example A1, except that the material of the bonding layer 2 was made niobium pentoxide and that sputtering was used for the film-formation of the bonding layer 2.

As a result, the separation of the bonded parts was not observed during the grinding and polishing steps of the piezoelectric single crystal substrate. Further, the bonding strength was evaluated by crack opening method and proved to be 1.6 $J/m^2$.

Comparative Example A1

In the Example A1, the bonded body 2 was produced according to the same procedure as the Example A1, except that the material of the bonding layer 2 was made silicon nitride and that sputtering was used for the film-formation of the bonding layer 2.

As a result, the separation of the bonded parts was observed during the grinding and polishing steps of the piezoelectric single crystal substrate. Further, the bonding strength was evaluated by crack opening method and proved to be 0.6 $J/m^2$.

Comparative Example A2

In the Example A1, the bonded body 2 was produced according to the same procedure as the Example A1, except that the material of the bonding layer 2 was made aluminum nitride and that sputtering was used for the film-formation of the bonding layer 2.

As a result, the separation of the bonded parts was observed during the grinding and polishing steps of the piezoelectric single crystal substrate. Further, the bonding strength was evaluated by crack opening method and proved to be 0.5 J/m².

Comparative Example A3

In the Example A1, the bonded body 2 was produced according to the same procedure as the Example A1, except that the material of the bonding layer 2 was made silicon oxide and that sputtering was used for the film-formation of the bonding layer 2.

As a result, the separation of the bonded parts was observed during the grinding and polishing steps of the piezoelectric single crystal substrate. Further, the bonding strength was evaluated by crack opening method and proved to be 0.1 J/m².

Comparative Example A4

As the Example A3, tantalum pentoxide layer was provided as the bonding layer 2. Then, a bonded body was produced as the Example A3, except that the surface of the bonding layer and the surface of the piezoelectric single crystal substrate were activated by plasma activation method. After the inside of the camber was evacuated to the order of $10^{-1}$ Pa, $N_2$ plasma (powder of 200 W) was irradiated onto the surface of the wafer for 60 seconds, which was then drawn out to the air and washed by pure water. The surfaces were further bonded in the air and a load of 2000N was applied for 2 minutes.

As a result, the separation of the bonded parts occurred during the grinding and polishing steps of the piezoelectric single crystal substrate. Further, the bonding strength was evaluated by crack opening method and proved to be 0.3 J/m². The above results were summarized in table 1.

TABLE 1

| | No. | Material of Bonding layer | Bonding method | Bonding strength (J/m2) | Separation during grinding and polishing steps |
|---|---|---|---|---|---|
| Examples | A1 | Mullite | FAB | 1.4 | None |
| | A2 | Al2O3 | FAB | 1.3 | None |
| | A3 | Ta2O5 | FAB | 1.3 | None |
| | A4 | TiO2 | FAB | 1.6 | None |
| | A5 | Nb2O5 | FAB | 1.6 | None |
| Comparative Examples | A1 | Si3N4 | FAB | 0.6 | Observed |
| | A2 | AlN | FAB | 0.5 | Observed |
| | A3 | SiO2 | FAB | 0.1 | Observed |
| | A4 | Ta2O5 | Plasma activation | 0.3 | observed |

Example B1

A bonded body was produced according to the method described referring to FIGS. 1, 3 and 4.

Specifically, a substrate (LT substrate) of lithium tantalate having an orientation flat (OF) part, a diameter of 4 inches and thickness of 250 μm was used as the piezoelectric single crystal substrate. Further, as the supporting body 1, it was prepared the body having an OF part, a diameter of 4 inches, a thickness of 230 μm and made of mullite. As the LT substrate, it was used LT substrate of 46° Y-cut X-propagation LT substrate, in which the direction of propagation of the surface acoustic wave (SAW) is X and the Y-cut plate is rotated in a cutting angle. The surface of the piezoelectric single crystal substrate was mirror-polished to an arithmetic average roughness Ra of 1 nm. The arithmetic surface roughness Ra of the surface 1a of the supporting body 1 of mullite was 2 nm. The arithmetic surface roughness was measured by an atomic force microscope (AFM) in a visual field of a square of a length of 10 μm and a width of 10 μm.

Then, a bonding layer 2 made of mullite was film-formed on the surface 1a of the supporting body 1 in 1.0μm by CVD method. Ra after the film-formation was 2.0 nm. Then, the bonding layer 2 was subjected to chemical mechanical polishing (CMP) so that the film thickness was made 0.5 μm and Ra was made 0.3 nm.

On the other hand, the surface 11a of the piezoelectric single crystal substrate 11 was roughened by a lapping machine to provide a roughened surface having an arithmetic surface roughness Ra of 0.1 μm.

Then, the intermediate layer 12 made of mullite was film-formed in 2 μm on the roughened surface 11a of the piezoelectric single crystal substrate 11 to fill the micro unevenness on the bottom surface. Besides, the surface 12a of the intermediate layer at this time had an arithmetic surface roughness Ra of 0.1 μm. Then, the surface 12a of the intermediate layer was subjected to chemical mechanical polishing (CMP) so that the film thickness was made 0.5 μm and Ra was made 0.3 nm.

Then, the flat surface 13a of the intermediate layer 13 on the piezoelectric single crystal substrate 11 and the flat surface 3a of the bonding layer 3 on the supporting body were cleaned to remove contamination, followed by introduction into a vacuum chamber. The chamber was evacuated to an order of $10^{-6}$ Pa and high speed atomic beam (acceleration voltage of 1 kV and Ar flow rate of 27 sccm) was irradiated onto the bonding surfaces of the respective substrates for 120 sec. Then, the activated surface 4 of the bonding layer 3A on the supporting body and activated surface 14 of the intermediate layer 13A on the piezoelectric single crystal substrate were contacted with each other, followed by pressurizing at 1000N for 2 minutes to bond the respective substrates.

Then, the surface 11c of the piezoelectric single crystal substrate 11 was ground and polished until the thickness was changed from the initial thickness of 250 μm to 20 μm.

As a result, the separation of the bonded parts was not observed during the grinding and polishing steps. Further, the bonding strength was evaluated by crack opening method and proved to be 1.6 J/m².

The thus produced bonded body was used to produce a SAW (surface acoustic wave) filter, which was heated at 300° C. The separation at the bonding interface and shift of frequency were not observed.

Example B2

In the Example B1, the material of the bonding layer 2 was made alumina and the film-formation of the bonding layer 2 was performed by sputtering method. Further, the material of the intermediate layer 13A was made alumina and the film-formation of the intermediate layer was performed using sputtering. The bonded body was produced while the other procedures were same as those in the Example B1.

As a result, the separation of the bonded parts was not observed during the grinding and polishing steps of the piezoelectric single crystal substrate. Further, the bonding strength was evaluated by crack opening method and proved to be 1.5 J/m².

The thus produced bonded body was used to produce a SAW (surface acoustic wave) filter, which was heated at 300° C. The separation at the bonding interface and shift of frequency were not observed.

Example B3

In the Example B1, the material of the bonding layer 2 was made tantalum pentoxide and the film-formation of the bonding layer 2 was performed by sputtering method. Further, the material of the intermediate layer 13A was made tantalum pentoxide and the film-formation of the intermediate layer was performed using sputtering. The bonded body was produced while the other procedures were same as those in the Example B1.

As a result, the separation of the bonded parts was not observed during the grinding and polishing steps of the piezoelectric single crystal substrate. Further, the bonding strength was evaluated by crack opening method and proved to be 1.6 J/m².

The thus produced bonded body was used to produce a SAW (surface acoustic wave) filter, which was heated at 300° C. The separation at the bonding interface and shift of frequency were not observed.

Example B4

In the Example B1, the material of the bonding layer 2 was made titanium oxide and the film-formation of the bonding layer 2 was performed by sputtering method. Further, the material of the intermediate layer 13A was made titanium oxide and the film-formation of the intermediate layer was performed using sputtering. The bonded body was produced while the other procedures were same as those in the Example B1.

As a result, the separation of the bonded parts was not observed during the grinding and polishing steps of the piezoelectric single crystal substrate. Further, the bonding strength was evaluated by crack opening method and proved to be 1.8 J/m².

The thus produced bonded body was used to produce a SAW (surface acoustic wave) filter, which was heated at 300° C. The separation at the bonding interface and shift of frequency were not observed.

Example B5

In the Example B1, the material of the bonding layer 2 was made niobium pentoxide and the film-formation of the bonding layer 2 was performed by sputtering method. Further, the material of the intermediate layer 13A was made niobium pentoxide and the film-formation of the intermediate layer was performed using sputtering. The bonded body was produced while the other procedures were same as those in the Example B1.

As a result, the separation of the bonded parts was not observed during the grinding and polishing steps of the piezoelectric single crystal substrate. Further, the bonding strength was evaluated by crack opening method and proved to be 1.8 J/m².

The thus produced bonded body was used to produce a SAW (surface acoustic wave) filter, which was heated at 300° C. The separation at the bonding interface and shift of frequency were not observed.

Comparative Example B1

The bonded body was produced according to the same procedure as the Example B1, except that the materials of the bonding layer 2 and intermediate layer 13A were made silicon nitride.

As a result, the separation of the bonded parts was observed during the grinding and polishing steps of the piezoelectric single crystal substrate. Further, the bonding strength was evaluated by crack opening method and proved to be 0.7 J/m².

Comparative Example B2

In the Example B1, the materials of the bonding layer 2 and the intermediate layer 13A were made aluminum nitride. The bonded body was produced while the other procedures were same as those in the Example B1.

As a result, the separation of the bonded parts was observed during the grinding and polishing steps of the piezoelectric single crystal substrate. Further, the bonding strength was evaluated by crack opening method and proved to be 0.6 J/m².

Comparative Example B3

In the Example B1, the materials of the bonding layer 2 and the intermediate layer 13A were made silicon oxide. The bonded body was produced while the other procedures were same as those in the Example B1.

As a result, the separation of the bonded parts was observed during the grinding and polishing steps of the piezoelectric single crystal substrate. Further, the bonding strength was evaluated by crack opening method and proved to be 0.1 J/m².

Comparative Example B4

In the Example B1, the materials of the bonding layer 2 and the intermediate layer 13A were made tantalum pentoxide. However, according to the present example, the surface of the bonding layer and the surface of the intermediate layer were activated by plasma activation method. The bonded body was produced while the other procedures were same as those in the Example B1. After the inside of the chamber was evacuated to an order of $10^{-1}$ Pa, $N_2$ plasma (powder of 200 W) was irradiated onto the surface of the wafer for 60 seconds, which was then drawn out to the air and washed by pure water. The surfaces were further bonded in the air and a load of 2000N was applied for 2 minutes.

As a result, the separation of the bonded parts was observed during the grinding and polishing steps of the piezoelectric single crystal substrate. Further, the bonding strength was evaluated by crack opening method and proved to be 0.3 J/m².

The above results were briefly summarized in table 2.

TABLE 2

|  | No | Material of Bonding layer | Bonding method | Bonding strength (J/m2) | Separation during Grinding and polishing steps | Shift of Frequency of SAW filter |
|---|---|---|---|---|---|---|
| Examples | B1 | Mullite | FAB | 1.6 | None | None |
|  | B2 | Al2O3 | FAB | 1.5 | None | None |
|  | B3 | Ta2O5 | FAB | 1.6 | None | None |
|  | B4 | TiO2 | FAB | 1.8 | None | None |
|  | B5 | Nb2O5 | FAB | 1.8 | None | None |
| Comparative Examples | B1 | Si3N4 | FAB | 0.7 | Observed | — |
|  | B2 | AlN | FAB | 0.6 | Observed | — |
|  | B3 | SiO2 | FAB | 0.1 | Observed | — |
|  | B4 | Ta2O5 | Plasma activation | 0.3 | Observed | — |

The invention claimed is:

1. A method of bonding a supporting body comprising a ceramic and a piezoelectric single crystal substrate, said method comprising the steps of:

forming a bonding layer over said supporting body, said bonding layer comprising one or more materials selected from the group consisting of mullite, alumina, tantalum pentoxide, titanium oxide and niobium pentoxide;

irradiating a first neutralized atomic beam onto a surface of said bonding layer to activate said surface of said bonding layer;

providing an intermediate layer over said piezoelectric single crystal substrate, said intermediate layer comprising one or more material selected from the group consisting of mullite, alumina, tantalum pentoxide, titanium oxide and niobium pentoxide;

irradiating a second neutralized atomic beam onto a surface of said intermediate layer to activate said surface of said intermediate layer; and bonding said surface of said bonding layer and said surface of said intermediate layer by direct bonding.

2. The method of claim 1, wherein said surface of said bonding layer is activated after said surface of said bonding layer is flattened.

3. The method of claim 1, further comprising the step of processing said piezoelectric single crystal substrate to form a roughened surface, wherein said intermediate layer is provided on said roughened surface.

4. The method of claim 1, wherein said surface of said intermediate layer is activated after said surface of said intermediate layer is flattened.

5. The method of claim 1, wherein said supporting body comprises a material selected from the group consisting of mullite, cordierite and sialon.

6. The method of claim 1, wherein said piezoelectric single crystal substrate comprises lithium niobate, lithium tantalate or lithium niobate-lithium tantalate solid solution.

* * * * *